(12) United States Patent
Drapkin et al.

(10) Patent No.: US 7,710,150 B2
(45) Date of Patent: *May 4, 2010

(54) METHOD AND APPARATUS FOR GENERATING A REFERENCE SIGNAL AND GENERATING A SCALED OUTPUT SIGNAL BASED ON AN INPUT SIGNAL

(75) Inventors: Oleg Drapkin, Richmond Hill (CA); Grigori Temkine, Markham (CA); Arvind Bomdica, Fremont, CA (US); Kevin Liang, Cupertino, CA (US)

(73) Assignee: ATI Technologies ULC, Markham, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/046,887

(22) Filed: Mar. 12, 2008

(65) Prior Publication Data

US 2008/0157817 A1 Jul. 3, 2008

Related U.S. Application Data

(63) Continuation of application No. 11/469,311, filed on Aug. 31, 2006, now Pat. No. 7,345,510.

(51) Int. Cl.
*H03K 19/0175* (2006.01)
(52) U.S. Cl. .............................. 326/80; 326/62; 326/63; 326/68
(58) Field of Classification Search ............. 326/62–63, 326/68, 80–81; 327/333
See application file for complete search history.

(56) References Cited

U.S. PATENT DOCUMENTS

| | | | |
|---|---|---|---|
| 5,789,942 A * | 8/1998 | Mizuno ........................ 326/81 |
| 6,066,975 A * | 5/2000 | Matano ....................... 327/333 |
| 6,130,557 A | 10/2000 | Drapkin et al. |
| 6,133,777 A | 10/2000 | Savelli |
| 6,268,744 B1 | 7/2001 | Drapkin et al. |
| 6,297,683 B1 | 10/2001 | Drapkin et al. |
| 6,342,996 B1 | 1/2002 | Drapkin et al. |
| 6,351,182 B1 | 2/2002 | Drapkin et al. |
| 6,362,942 B2 | 3/2002 | Drapkin et al. |
| 6,373,282 B1 | 4/2002 | Drapkin et al. |
| 6,400,546 B1 | 6/2002 | Drapkin et al. |
| 6,429,716 B1 | 8/2002 | Drapkin et al. |
| 6,466,054 B2 * | 10/2002 | Kameyama et al. ........... 326/68 |
| 6,480,051 B2 | 11/2002 | Drapkin et al. |
| 6,833,746 B2 | 12/2004 | Drapkin et al. |

* cited by examiner

*Primary Examiner*—Anh Q Tran
(74) *Attorney, Agent, or Firm*—Vedder Price P.C.

(57) ABSTRACT

An input signal is routed to a first logic one reference signal generator or alternatively routed to a second logic one reference signal generator based at least one a voltage level of the input signal. When the voltage level of the input signal is less than a threshold value, the first logic one reference signal generator selectively generates a first logic one reference signal. When the voltage level of the input signal is greater than or equal to the threshold value, the second logic one reference signal generator alternatively generates a second logic one reference signal. The first and second logic one reference signals may be used to control a first voltage scaling circuit that drives a scaled output signal having a logic one value corresponding to the voltage level of the first logic one reference signal.

20 Claims, 6 Drawing Sheets

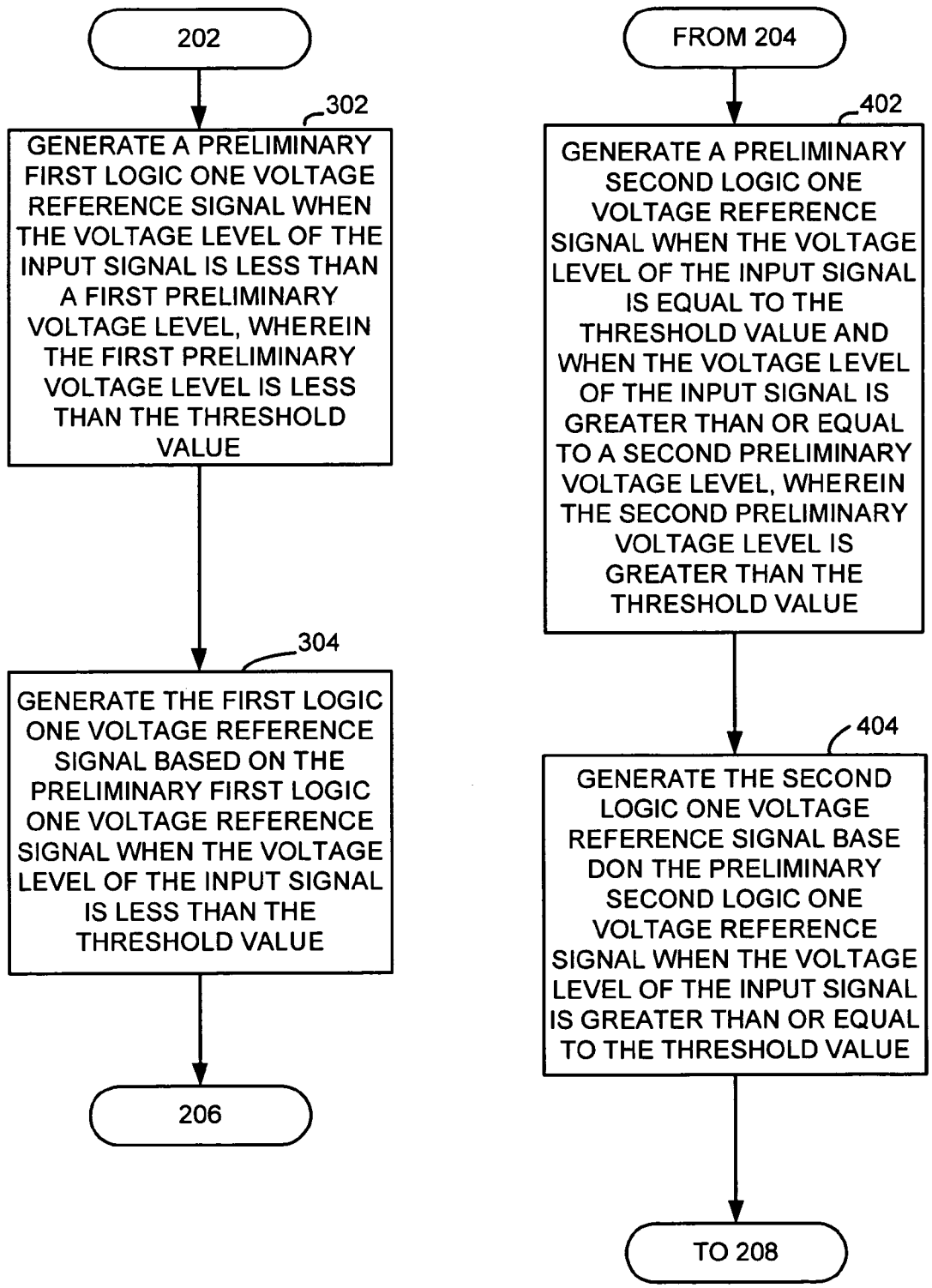

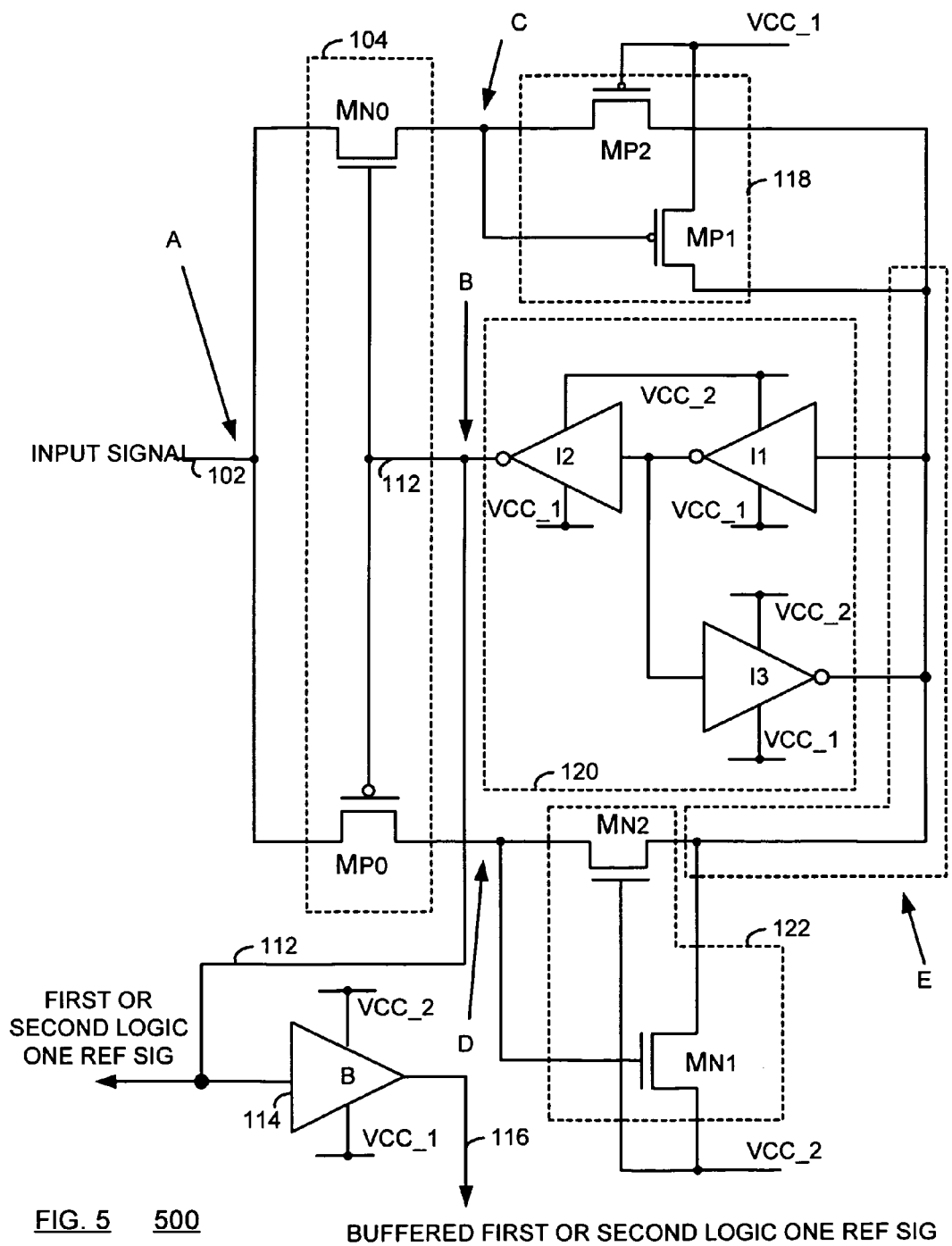
FIG. 5    500

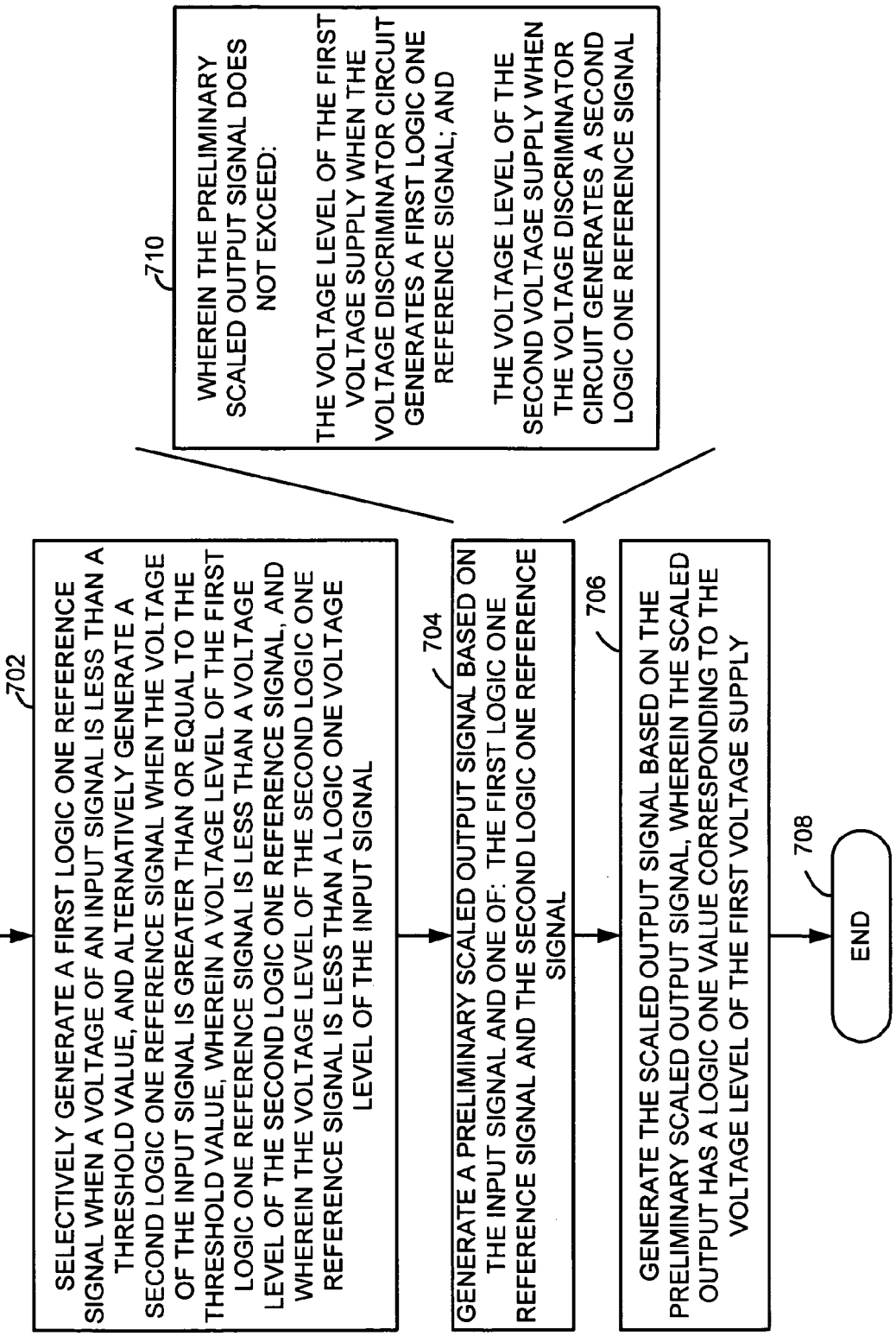

METHOD AND APPARATUS FOR GENERATING A REFERENCE SIGNAL AND GENERATING A SCALED OUTPUT SIGNAL BASED ON AN INPUT SIGNAL

RELATED CO-PENDING APPLICATION

This application is a continuation of co-pending U.S. application Ser. No. 11/469,311, filed Aug. 31, 2006, entitled "METHOD AND APPARATUS FOR GENERATING A REFERENCE SIGNAL AND GENERATING A SCALED OUTPUT SIGNAL BASED ON AN INPUT SIGNAL", having as inventors Oleg Drapkin et al., owned by instant assignee and incorporated in its entirety herein by reference.

FIELD OF THE INVENTION

The invention generally relates to voltage discriminators and voltage scaling and, more specifically, generating a scaled output signal have a logic one voltage level lower than the logic one voltage level of an input signal.

BACKGROUND OF THE INVENTION

Modern electronic devices such as, but not limited to, mobile devices and traditional computer systems are consistently being driven to operate faster and consume less power. One way to meet these demands is to supply ICs with a faster clock and a smaller voltage supply while reducing the gate thickness of individual transistors on the ICs and thus reducing logic one voltage levels. While this has largely proved successful, many ICs must be compatible to interact with other ICs that have larger power supply voltages, thicker transistor gates and higher logic one voltage values. For example, it is not uncommon for digital circuitry located on, for example, a chip set circuit to interact with several peripheral devices over one or more suitable physical buses. As known to those of ordinary skill in the art, a chip set circuit may include a north bridge circuit, a south bridge circuit, a combined north bridge and south bridge circuit or any other suitable memory bridge circuit that is coupled to, among other things, one or more processors and peripheral devices such as keyboards, a mouse, etc. and one or more memory devices. While it is desirable to fabricate chip set circuits and other ICs using fast transistors having a small gate thickness and small power supplies, such circuits may need to interact with other ICs such as peripheral device ICs having transistors with thick gates and large power supplies. However, if a chip set circuit or other IC having fast, thin gate transistors receives digital logic values from peripheral devices having transistors with thicker gates and larger power supplies (and thus larger logic one voltage values), the chip set circuit transistors might be damaged and rendered unoperational.

For example, a chip set circuit might be designed to operate using a voltage supply of 1.8 V and use single gate oxide transistors such as MOSFETs with a relatively thin gate oxide thickness to support processing speeds of up to several hundred MHz and thus generating a 1.8 V logic one value. Hereinafter, transistors supporting a 1.8 V power supply and generating a 1.8 V logic one value, as described above, are referred to as "1X" transistors. Transistors, such as 1X transistors, are generally designed based on, among other things, a reliability criterion. The reliability criterion indicates how reliable the transistor will be over a period of time when exposed to a variety of voltage differences between any two terminals of the transistor. As understood by one having ordinary skill in the art, 1X transistors presently have a reliability criterion indicating that they will provide 10 years of reliable operation if exposed to no more than 1.8 V plus a predetermined tolerance voltage between any two terminals. The predetermined tolerance value may be any suitable percentage or voltage amount. However, it is not uncommon to see tolerance values expressed as 20%.

The chip set circuit may need to communicate with a first circuit that operates using a voltage supply of 3.3 V and having single gate oxide transistors such as MOSFETs with a relatively larger gate thickness to support processing speeds of up to tens of MHz and thus generating a logic one voltage value of 3.3 V. Hereinafter, transistors supporting a 3.3 V power supply and generating a 3.3 V logic one value, as described above, are referred to as "2X" transistors. 2X transistors presently have a reliability criterion indicating that they will provide 10 years of reliable operation if exposed to a maximum voltage difference of 3.3 V plus a predetermined tolerance value between any two terminals. Similar to 1X transistors, 2X transistors may have any suitable tolerance value, percentage or amount. It is not uncommon to see tolerance values expressed as 20%.

Similarly, the chip set circuit may need to communicated with a second circuit that operates using a voltage supply of 5.0 V and having single gate oxide transistors such as MOSFETs with a relatively larger gate thickness when compared to 1X and 2X transistors to support processing speeds in the low MHz range and generating a 5.0 V logic one value. Hereinafter, transistors supporting a 5.0 V voltage swing, as described above, are referred to as "3X" transistors. 3X transistors presently have a reliability criterion indicating that they will provide 10 years of reliable operation if exposed to a maximum voltage difference of 5.0 V plus a predetermined tolerance value between any two terminals. Similar to 1X transistors and 2X transistors, 3X transistors may have any suitable tolerance value, percentage or amount. It is not uncommon to see tolerance values expressed as 20%.

However, the chip set circuit or other IC having 1X transistors cannot handle input signals having logic one values generated by the circuits having a 2X or 3X transistors. Prior art solutions utilized, among other things, a resister divider to scale the voltage level of input signals thereby reducing the logic one voltage levels to a level the chip set circuit or other IC could properly handle. However, the user of a resister divider, provides undesirable effects such as sinking current from the input signal and thus interfering with signal integrity. Resister dividers also allowed static leakage current when the input signal was high and thus adversely consumed power.

Accordingly a need exists for, among other things, generating a scaled output signal that has a lower logic one value than the logic one value of the underlying input signal. A similar need exists for efficiently generating the scaled output signal using a low power supply and thin gate transistors. For purposes of illustration only, a need exists for efficiently scaling input signals acceptable for 3X transistors into input signals acceptable for 1X transistors. Scaling larger logic one voltage levels to smaller logic one voltage levels allows for safe interpretation of digital logic signals by ICs with thinner gate oxide transistors and lower power supply voltages. A similar need exists for scaling an input signal while not sinking current or creating static leakage current.

Another need exists for discerning the voltage level of an input signal and generating a reference signal based on the voltage level of the input signal. A similar need exists for discerning the voltage level of the input signal and generating a representative voltage reference signal while not sinking current or creating static leakage current.

BRIEF DESCRIPTION OF THE DRAWINGS

The invention will be more readily understood in view of the following description when accompanied by the below figures and wherein like reference numerals represent like elements:

FIGS. 3-4 are detailed flow charts illustrating examples for generating a first logic one reference signal and a second logic one reference signal in accordance with FIG. 2;

FIG. 5 is a schematic of one example of the integrated circuit of FIG. 1;

FIG. 7 is a flow chart illustrating a method for generating a scaled output signal based on an input signal and a logic one reference signal in accordance with one embodiment of the present disclosure.

DETAILED DESCRIPTION

Figure 1:
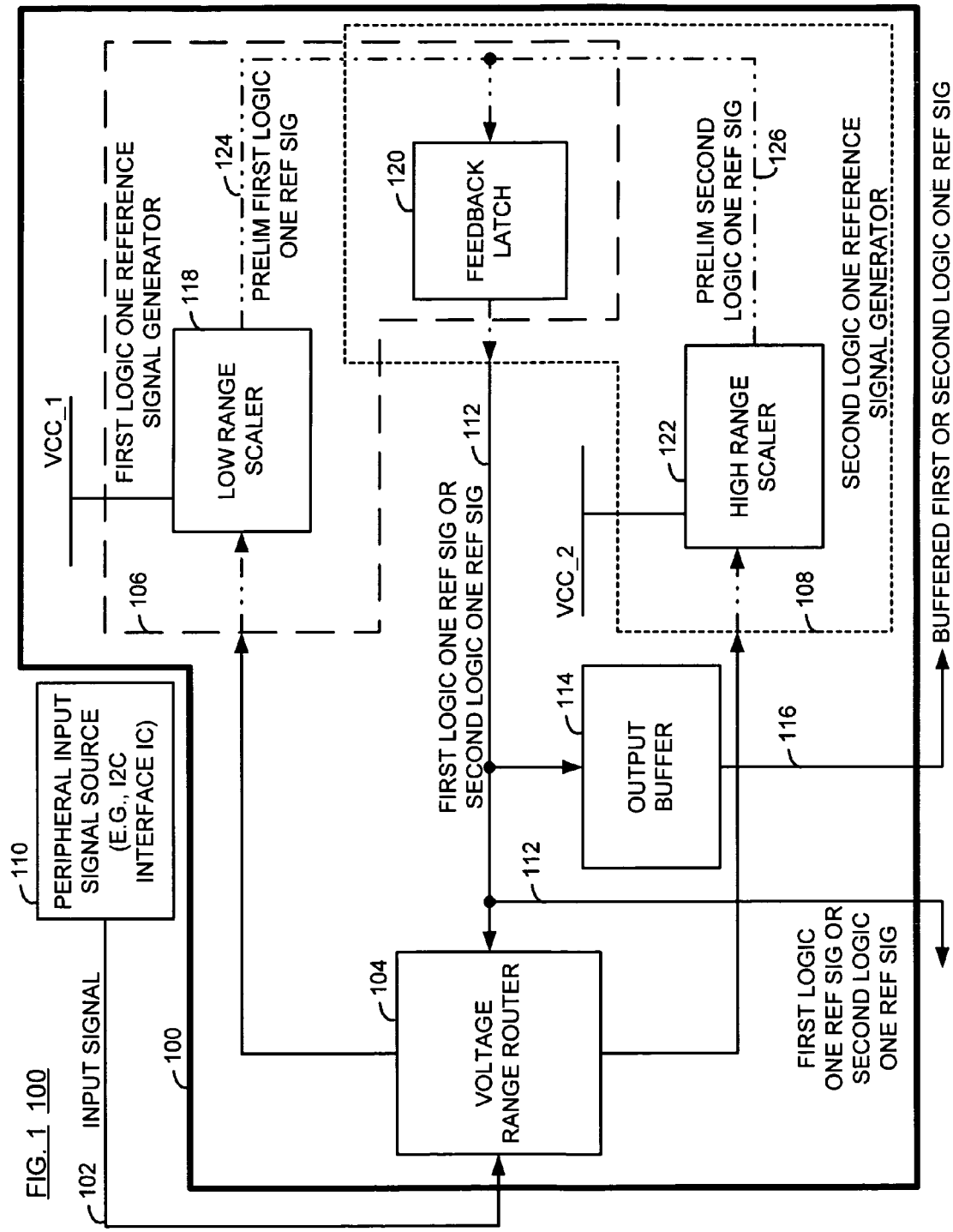
FIG. 1 is a block diagram illustrating one example of an integrated circuit operative to generate a logic one reference signal based on an input signal and wherein the integrated circuit includes, among other things, a voltage range router, a first logic one reference signal generator and a second logic one reference signal generator in accordance with one embodiment of the present disclosure.

Generally, the present description provides a method and apparatus for generating one of: a first logic one reference signal and a second logic one reference signal in response to an input signal. A voltage range router routes the input signal to one of: a first logic one reference signal generator and a second logic one reference signal generator based on at least a voltage level of the input signal. When the voltage level of the input signal is less than a threshold value, the first logic one reference signal generator selectively generates the first logic one reference signal. Alternatively, when the voltage level of the input signal is greater than or equal to the threshold value, the second logic one reference signal generator selectively generates the second logic one reference signal.

In one embodiment, the first logic one reference signal generator is coupled to a first voltage supply such that the voltage level of the first logic one reference signal corresponds to the voltage level of the first voltage supply. Similarly, the second logic one reference signal generator is coupled to a second voltage supply such that the voltage level of the second logic one reference signal corresponds to the voltage level of the second voltage supply. The logic one voltage level of the input signal is greater than the voltage levels of both the first and second voltage supplies while the voltage level of the second voltage supply is greater than the voltage level of the first voltage supply.

In one embodiment, each of the voltage range router and the first and second logic one reference signal generators include a plurality of integrated circuit components each having at least two terminals where each integrated circuit components is designed and/or connected so that a maximum voltage difference between any two terminals does not exceed a voltage level of the first logic one reference signal (e.g., the first voltage supply) plus a predetermined tolerance. In one embodiment, each integrated circuit component is connected so that there is effectively no static leakage current across any integrated circuit terminal.

In one embodiment, each of the voltage range router and the first and second logic one reference signal generators include a plurality of single gate oxide MOSFETs where each MOSFET is designed and/or connected so that a maximum voltage difference between any two terminals does not exceed a voltage level of the first logic one reference signal (e.g., the first voltage supply) plus a predetermined tolerance. In one embodiment, each MOSFET is connected such that there is effectively no static leakage current across any terminal of the MOSFET.

In one embodiment, the first logic one reference signal generator includes a low range scaler and a feedback latch such that when the voltage level of the input signal is less than a first preliminary voltage level, the low range scaler generates a preliminary first logic one reference signal. The first preliminarily voltage level may be any suitable value less than the threshold value. In response, the feedback latch generates the first logic one reference signal when the voltage level of the input signal is less than the threshold voltage.

Similarly, the second logic one reference signal generator includes a high range scaler and the feedback latch such that when the voltage level of the input signal is equal to or greater than a second preliminary voltage level, the high range scaler generates a preliminary second logic one reference signal. The second preliminarily voltage level may be any suitable value greater than the threshold value. In response, the feedback latch generates the second logic one reference signal when the voltage level of the input signal is greater than or equal to the threshold voltage.

The present description also provides a method and apparatus for generating a scaled output signal using the voltage discriminator circuit. In one embodiment, the integrated circuit that generates the scaled output signal includes the voltage discriminator circuit, a first voltage scaling circuit and a second voltage scaling circuit. The first voltage scaling circuit receives the input signal and one of the first and second logic one reference signals. The output of the first voltage scaling circuit does not exceed the voltage level of the first voltage supply when the voltage discriminator circuit generates a first logic one reference signal and does not exceed the voltage level of the second voltage supply when the voltage discriminator circuit generates a second logic one reference signal. The output of the first voltage scaling circuit, a preliminary scaled output signal, drives the second voltage scaling circuit to generate the scaled output signal. The second voltage scaling circuit is coupled to the first voltage supply and the scaled output signal generally mirrors or corresponds to the input signal, but has a logic one value corresponding to the voltage level of the first voltage supply.

In one embodiment, each of the voltage discriminator circuit, the first voltage scaling circuit and the second voltage scaling circuit comprises one or more integrated circuit components each having at least two terminals and wherein a maximum voltage difference between any two terminals of each integrated circuit component does not exceed a voltage level of the first logic one reference signal plus a predetermined tolerance. In one embodiment, each integrated circuit component is connected so that there is effectively no static leakage current across any integrated circuit terminal.

The present disclosure can be more fully described with reference to FIGS. 1-7. In the following detailed description, numerous specific details are set forth in order to provide a thorough understanding of the present disclosure. It will be apparent to one of ordinary skill in the art, however, that these specific details need not be used to practice the present embodiments of the disclosure. In other instances, well-known structures, interfaces, and processes have not been shown or have not been shown in detail in order not to unnecessarily obscure the present disclosure.

FIG. 1 is a block diagram illustrating one example of an integrated circuit 100 operative to generate one of two possible logic one reference signals based on an input signal 102 and wherein the integrated circuit 100 includes, among other things, a voltage range router 104, a first logic one reference signal generator 106 and a second logic one reference signal generator 108 in accordance with one embodiment of the present disclosure. As illustrated, the first logic one reference signal generator 106 is coupled to a first voltage supply VCC_1 while the second logic one reference signal generator 108 is coupled to a second voltage supply VCC_2. The second voltage supply VCC_2 has a greater voltage level than the first voltage supply VCC_1. Input signal 102 may be any signal representing digital logic values such as a logic zero and a logic one. As understood in the art, a logic one generally corresponds to a "high" voltage level while a logic zero generally corresponds to a "low" voltage level. The input signal 102 must have a logic one voltage greater than the second voltage supply VCC_2.

The integrated circuit 100 and its components, as described below, may be fabricated on one or more integrated circuits or integrated circuit packages. As illustrated, the integrated circuit 100 may be coupled to a peripheral input signal source 110 that provides the input signal 102. Peripheral input signal source 110 in one embodiment is an I²C interface that generates an input signal 102 having a 5.0 V logic one value, as known in the art. One having ordinary skill in the art will recognize that other circuit interfaces such as peripheral device interfaces and other suitable devices may be used to generate and/or provide input signal 102.

The voltage range router 104 is coupled to receive the input signal 102 and is further coupled to both the first logic one reference signal generator 106 and the second logic one reference signal generator 108. Based on at least the voltage level of the input signal 102, the voltage range router 104 routes the input signal 102 to one of the first logic one reference signal generator 106 and the second logic one reference signal generator 108. In one embodiment, the voltage range router 104 routes the input signal 102 to the first logic one reference signal generator 106 when the voltage level of the input signal is less than a first preliminary voltage level. In the same embodiment, the voltage range router 104 routes the input signal 102 to the second logic one reference signal generator 108 when the voltage level of the input signal is equal to or greater than a second preliminary voltage level where the second preliminary voltage level is greater than the first preliminary voltage level.

The first logic one reference signal generator 106 selectively generates a first logic one reference signal 112 having a voltage level corresponding to the voltage level of the first voltage supply VCC_1 when the voltage level of the input signal 102 is less than a threshold value. The threshold value is greater than the first preliminary voltage value level but less than the second preliminary voltage level. Similarly, the second logic one reference signal generator 108 selectively generates a second logic one reference signal 112 having a voltage level corresponding to the voltage level of the second voltage supply VCC_2 when the voltage level of the input signal 102 is greater than or equal to the threshold value. The generated first logic one reference signal 112 or the generated second logic one reference signal 112 is passed to an output buffer 114 or directly provided as an output. As further explained with the embodiment illustrated in FIG. 5, the generated first or second logic one reference signal 112 may also be passed to the voltage range router 104 and used to selectively route the input signal 102 to the first logic one reference signal generator 106 or alternatively route the input signal 102 to the second logic one reference signal generator 108.

If the generated first or second logic one reference signal 112 is passed to an output buffer 114, the generated first or second logic one reference signal 112 may be buffered to generate a corresponding buffered first or second logic one reference signal 116. In either event, the first or second logic one reference signal 112 or the buffered first or second logic one reference signal 116 may be used by another circuit or by any suitable system such as the integrated circuit of FIG. 6 as explained below.

In one embodiment, the first logic one reference signal generator 106 comprises a low range scaler 118 coupled to a feedback latch 120. Similarly, the second logic one reference signal generator 108 comprises a high range scaler 122 coupled to the feedback latch 120. The low range scaler 118 is coupled to the first power supply VCC_1 while the high range scaler 122 is coupled to the second power supply VCC_2.

As previously mentioned, input signal 102 represents digital logic values such as a logic one and a logic zero. During transitions between the two states, the input signal 102 is quickly rising from a logic zero to a logic one or quickly falling from a logic one to a logic zero. When the input signal 102 has a voltage level less than the first preliminary voltage level, the voltage range router 104 routes the input signal 102 to the low range scaler 118 which generates a preliminary first logic one reference signal 124. The preliminary first logic one reference signal 124 has a voltage level equivalent to the voltage level of the first voltage supply VCC_1. In other words, the low range scaler 118 scales the input signal 102 to the voltage level of the first voltage supply VCC_1. The feedback latch 120 receives the preliminary first logic one reference signal 124 and generates the first logic one reference signal 112 based thereon. The first logic one reference signal 112 has the same voltage level as the preliminary first logic one reference signal 124.

When the input signal 102 has a voltage level greater than the first preliminary voltage level but less than the threshold voltage, the voltage range router 104 does not route the input signal 102 to either of the low range scaler 118 or the high range scaler 122. However, during this voltage range, the feedback latch 120 continues to generate the first logic one reference signal 112 based on feedback provided internally.

When the input signal 102 has a voltage level equal to the threshold value, the voltage range router 104 routes the input signal 102 to the high range scaler 122 which generates the preliminary second logic one reference signal 126. The preliminary second logic one reference signal 126 has a voltage level equivalent to the voltage level of the second voltage supply VCC_2. In other words, the high range scaler 122 scales the input signal 102 to the voltage level of the second voltage supply VCC_2. The feedback latch 120 receives the preliminary second logic one reference signal 126 and generates the second logic one reference signal 112 based thereon. The second logic one reference signal 112 has the same voltage level as the preliminary second logic one reference signal 126.

When the input signal 102 has a voltage level greater than the threshold voltage but less than a second predetermined voltage level, the voltage range router 104 does not route the input signal 102 to either of the low range scaler 118 or the high range scaler 122. However, during this voltage range, the feedback latch 120 continues to generate the second logic one reference signal 112 based on feedback provided internally.

When the input signal 102 has a voltage level greater than or equal to the second predetermined voltage level, the voltage range router 104 routes the input signal 102 to the high range scaler 122 which generates the preliminary second logic one reference signal 126. The preliminary second logic one reference signal 126 has a voltage level equivalent to the voltage level of the second voltage supply VCC_2. In other words, the high range scaler 122 scales the input signal 102 to the voltage level of the second voltage supply VCC_2. The feedback latch 120 receives the preliminary second logic one reference signal 126 and generates the second logic one reference signal 112 based thereon. The second logic one reference signal 112 has the same voltage level as the preliminary second logic one reference signal 126 but is delayed in time.

Accordingly a first logic one reference signal 112 having a voltage level corresponding to the voltage level of the first voltage supply VCC_1 is generated whenever the voltage level of the input signal 102 is less than a threshold voltage. However, whenever the input signal 102 is greater than or equal to the threshold voltage, a second logic one reference signal 112 having a voltage level corresponding to the voltage level of the second voltage supply VCC_2 is generated.

In one embodiment, each of the voltage range router and the first and second logic one reference signal generators include a plurality of integrated circuit components each having at least two terminals where each integrated circuit components is designed and/or connected so that a maximum voltage difference between any two terminals does not exceed a voltage level of the first logic one reference signal (e.g., the first voltage supply) plus a predetermined tolerance. In one embodiment, each integrated circuit component is connected so that there is effectively no static leakage current across any integrated circuit terminal.

Figure 2:
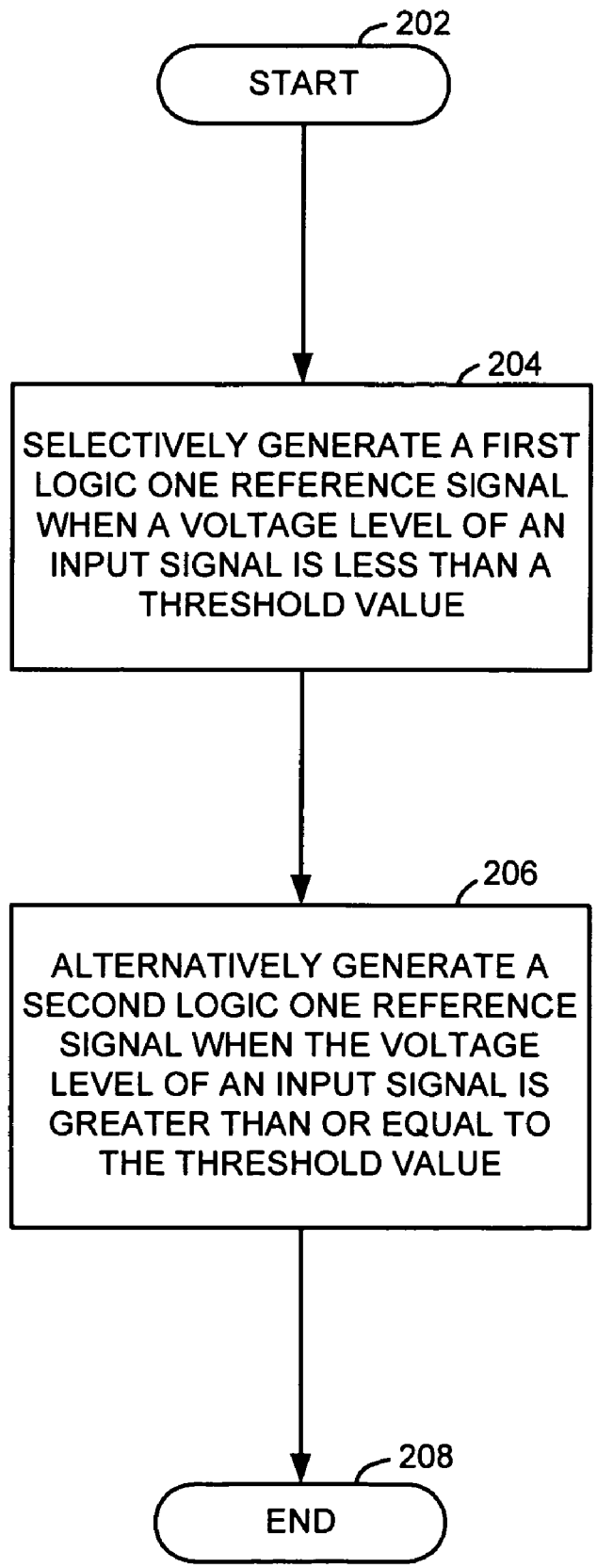
FIG. 2 is a flow chart illustrating a method for generating a logic one reference signal in accordance with one embodiment of the present disclosure.

FIG. 2 is a flow chart illustrating a method for generating a logic one reference signal in accordance with one embodiment of the present disclosure. The method begins in block 202 where, for example, an input signal is generated by a peripheral input signal source 110 as illustrated in FIG. 1. Block 202 may also include receiving the input signal and routing it to one of two reference signal generators based on at least the voltage level of the input signal as explained below. The method continues in block 204 where a first logic one reference signal is selectively generated when a voltage level of the input signal is less than a threshold value. In one embodiment, this may be implemented using the first logic one reference signal generator 106. In block 206, a second logic one reference signal is alternatively generated when the voltage level of the input signal is greater than or equal to the threshold value. For purposes of example, this may be implemented using the second logic one reference signal generator 108 of FIG. 1. The method ends in block 208, where for example, the first logic one reference signal or the second logic one reference signal is output to any suitable circuit or buffered by a suitable buffer for subsequent output. In one embodiment, block 208 also includes using the generated first or second logic one reference signal to determine the routing of the input signal as explained below in FIG. 5.

FIGS. 3-4 are detailed flow charts illustrating examples for generating a first logic one reference signal and a second logic one reference signal in accordance with FIG. 2. FIG. 3 is a detailed embodiment of block 204 and thus begins with block 202 and continues with block 302 where a preliminary first logic one voltage reference signal is generated when the voltage level is less than a preliminary voltage level, wherein the preliminary voltage level is less than the threshold value. Next, the method includes block 304 where the first logic one voltage reference signal is generated based on the preliminary first logic one voltage reference signal when the voltage level of the input signal is less than the threshold value. For purposes of example, blocks 302-304 may be implemented using low range scaler 118 and feedback logic 120 as described above. The method concludes with block 206.

FIG. 4 is a detailed embodiment of block 206 and thus begins with block 204 and includes block 402 where a preliminary second logic one voltage reference signal is generated when the voltage level of the input signal is equal to the threshold value and when the voltage level of the input signal is greater than or equal to a second preliminary voltage level, wherein the second preliminary voltage level is greater than the threshold value. The method then continues in block 404 where the second logic one voltage reference signal is generated based on the preliminary second logic one voltage reference signal when the voltage level of the input signal is greater than or equal to the threshold value. The method then concludes with block 208. In one embodiment, the method of blocks 402-404 may be implemented using the high range scaler 122 and the feedback latch 120 as described above with reference to FIG. 1.

In one embodiment, the selective generation of the first logic one reference signal and the alternative generation of the second logic one reference signal is performed by a plurality of integrated circuit components each having at least two terminals and wherein a maximum voltage difference between any two terminals of each integrated circuit component does not exceed a voltage level of the first logic one reference signal plus a predetermined tolerance. In one embodiment, each integrated circuit component is connected so that there is effectively no static leakage current across any integrated circuit terminal.

FIG. 5 is a schematic of one example of the integrated circuit 100 of FIG. 1. The integrated circuit minimally comprises the voltage range router 104, the low range scaler 118, the feedback latch 120 and the high range scaler 122. The voltage range router 104 includes a voltage range router NMOS transistor $M_{N0}$ and a voltage range router PMOS transistor $M_{P0}$. First terminals of each of $M_{N0}$ and $M_{P0}$ are coupled together to form a first input of the voltage range router 104 as indicated by alpha reference numeral A. At the first input of the voltage range router 104, input signal 102 is received. The gates of each of $M_{N0}$ and $M_{P0}$ are coupled together to form a second input of the voltage range router 104 as indicated by alpha reference numeral B. The second terminal of $M_{N0}$ is coupled to the low range scaler 118 to form a first output of voltage range router 104 as indicated by alpha reference numeral C. The second terminal of $M_{P0}$ is coupled to the high range scaler 122 to form a second output of the voltage range router 104 as indicated by alpha reference numeral D.

The low range scaler 118 minimally includes a first low range PMOS transistor $M_{P1}$ wherein the gate of $M_{P1}$ is coupled to the second terminal of $M_{N0}$ at the first output of the voltage range router 104 at reference numeral C. The source of $M_{P1}$ is coupled to the first voltage supply VCC_1.

The high range scaler 122 includes a first high range NMOS transistor $M_{N1}$ and a second high range NMOS transistor $M_{N2}$. The gate of $M_{N1}$ is operatively coupled to a second terminal of $M_{P0}$ and a first terminal of $M_{N2}$ thereby forming the second output of the voltage range router 112 as indicated by reference numeral D. A source of $M_{N1}$ is operatively coupled to a gate of $M_{N2}$ and a second voltage supply VCC_2, and a drain of $M_{N1}$ is operatively coupled to a second terminal of $M_{N2}$ and a drain of $M_{P1}$.

The feedback latch 120 includes a first inverter I1, a second inverter I2, and a third inverter I3. The input of the first inverter I1 is coupled to the output of the third inverter I3, the second terminal of $M_{N2}$ and the drains of $M_{N1}$ and $M_{P1}$ thereby forming a feedback latch input as indicated by alpha reference numeral E. The output of the first inverter I1 is coupled to the input of the second inverter I2 and the input of the third inverter I3. The output of the second inverter I2 is coupled to the second input of the voltage range router 102 (at reference numeral B). As illustrated, each of the first inverter I1, the second inverter I2, and the third inverter I3 are coupled to the first supply voltage VCC_1 and the second supply voltage VCC_2.

When the input signal 102 has a voltage level less than the first preliminary voltage level, $M_{N0}$ starts conducting (i.e., it turns on) and passes the input signal 102 to the low range scaler 118. The first preliminary voltage level may be, for example, (VCC_1—$V_{TN}$) where $V_{TN}$ represents the threshold voltage for $M_{N0}$. As understood by those having skill in the art, $M_{N0}$ is on because the voltage level at the gate (i.e., at reference numeral B) cannot fall below VCC_1. Accordingly, the voltage range router routes the input signal 102 to the low range scaler 118 where $M_{P1}$, turns on. Thus, the low range scaler 118 generates the preliminary first logic one reference signal (124 in FIG. 1) at its drain wherein the voltage of the preliminary first logic one reference signal (124 in FIG. 1) corresponds to the voltage level of the first voltage supply VCC_1. The feedback latch input (at reference numeral E) sees the voltage at the drain of $M_{P1}$, and the feedback latch 120 generates the first logic one reference signal 112 at the output of I2.

When the input signal 102 has a voltage level greater than the first preliminary voltage level of, for example, (VCC_1–$V_{TN}$) but less than the threshold voltage of, for example, [(VCC_1+$V_{TP}$) where $V_{TP}$ represents the threshold voltage for $M_{P0}$], the voltage range router 104 does not route the input signal 102 to either of the low range scaler 118 or the high range scaler 122 because both $M_{N0}$ and $M_{P0}$ are off. However, during this voltage range, the feedback latch 120 continues to generate the first logic one reference signal 112 based on feedback provided internally via inverter I3. As illustrated, during this voltage range, the initial feedback latch input voltage (at reference numeral E) has a voltage level corresponding to the first power supply VCC_1. Thus, the output of the first inverter I1 has a voltage level corresponding to the voltage level of the second power supply VCC_2 and the output of third inverter I3 keeps the feedback latch input voltage constant. The constant VCC_1 voltage level seen at the input of the feedback latch 120 maintains the generation of the first logic one reference signal 112.

When the input signal 102 has a voltage level equal to the threshold value of, for example, (VCC_1+$V_{TP}$), the voltage range router 104 routes the input signal 102 to the high range scaler 122 by turning off $M_{N0}$ and turning on $M_{P0}$. The high range scaler 122 generates the preliminary second logic one reference signal (126 of FIG. 1) because $M_{P0}$ passes the input signal 102 through to the second output of the voltage range router 104 (at reference numeral D) thereby turning on $M_{N2}$ and generating the preliminary second logic one reference signal (126 of FIG. 1). By turning $M_{N2}$ on, the voltage level at the feedback latch input is raised and, based on the design of the first inverter I1, the voltage level seen is enough to cause the first inverter I1 to have a voltage level at its output corresponding to the first power supply voltage VCC_1. This causes the second inverter I2 to generate the second logic one reference signal 112 having a voltage level of VCC_2. As understood by those of ordinary skill in the art, the specific example of the threshold value (VCC_1+$V_{TP}$) may not be enough to switch the output of first inverter I1. Accordingly, it is understood that this value is for purposes of example and that the actual switching point of the first inverter I1 may be any suitable threshold value that switches the output of first inverter I1.

When the input signal 102 has a voltage level greater than the threshold voltage of, for example, (VCC_1+$V_{TP}$), but less than a second predetermined voltage level of for example. (VCC_2+$V_{TP}$), the voltage range router 104 does not route the input signal 102 to either of the low range scaler 118 or the high range scaler 122 because both $M_{N0}$ and $M_{P0}$ are off. However, during this voltage range, the feedback latch 120 continues to generate the second logic one reference signal 112 based on feedback provided internally via inverter I3. As illustrated, the during this voltage range, the initial feedback latch input voltage (at reference numeral E) has a voltage level corresponding to the second power supply VCC_2. Thus, the output of the first inverter I1 has a voltage level corresponding to the voltage level of the first power supply VCC_1 and the output of third inverter I3 keeps the feedback latch input voltage constant. The constant VCC_2 voltage level seen at the input of the feedback latch maintains the generation of the second logic one reference signal 112.

When the input signal 102 has a voltage level greater than or equal to the second predetermined voltage level of, for example, (VCC_2+$V_{TP}$), the voltage range router 104 routes the input signal 102 again to the high range scaler 122 because $M_{P0}$ turns on. $M_{P0}$ passes the input signal 102 through to the second output of the voltage range router (at reference numeral D) thereby turning on $M_{N1}$ (while $M_{N2}$ is off) and generates the preliminary second logic one reference signal (126 of FIG. 1). By turning $M_{N1}$ on, the voltage level at the feedback latch input stays at the level of the second power supply VCC_2. This causes the second inverter I2 to maintain the generation of the second logic one reference signal 112 having a voltage level of VCC_2.

While the above example illustrates how circuit 500 operates as the voltage level of the input signal 102 rises from a logic zero to a logic one where the logic 1 value is greater than the voltage level of the second voltage supply VCC_2, it is recognizable by those having ordinary skill in the art that circuit 500 (and circuit 100) are adaptable to situations where the voltage level of the input signal 102 is reduced from a logic one to a logic zero. The process essentially is the reverse of that described above.

Accordingly, a first logic one reference signal 112 having a voltage level corresponding to the voltage level of the first voltage supply VCC_1 is generated whenever the voltage level of the input signal 102 is less than a threshold voltage. However, whenever the input signal 102 is greater than or equal to the threshold voltage, a second logic one reference signal 112 having a voltage level corresponding to the voltage level of the second voltage supply VCC_2 is generated. As indicated in FIG. 5, the first or second logic one reference signal 112 may be directly output or temporarily buffered by output buffer B to generate the buffered first or second logic one reference signal 116.

In one embodiment, the low range scaler 118 further includes a second low range PMOS transistor $M_{P2}$ wherein the gate of $M_{P2}$ is coupled to the first voltage supply VCC_1, a first terminal is coupled to the first voltage range router output (at reference numeral C) and a second terminal is coupled to the feedback latch input (at reference numeral E).

$M_{P2}$ is selectively turned on when the $M_{N0}$ is turned off (i.e., when the voltage level of the input signal is greater than the first preliminary level) to reduce any current leakage across $M_{N0}$ by producing a constant voltage level at the first voltage range router output (at reference numeral C) and thus not allowing a floating terminal. Similarly, when $M_{P0}$ is turned off (i.e., when the voltage level of the input signal 102 is less than the threshold value and when the input voltage level of the input signal 102 is greater than the threshold value but less than the second preliminary level), $M_{N2}$ is also turned on to prevent current leakage across $M_{P0}$.

Each of the transistors $M_{N0}$–$M_{N2}$ and $M_{P0}$–$M_{P2}$, inverters I1-I3 and the buffer B may be implemented on one or more integrated circuits or integrated circuit packages and in one embodiment are fabricated using MOS technology. For example, inverters I1-I3 and buffer B may be implemented using CMOS. In one embodiment, each of the transistors comprising circuit 500 are fabricated using single gate oxide MOSFETs where each MOSFET has the same gate oxide thickness. In a preferred embodiment, each of the MOSFETs are designed and connected so that a maximum voltage difference between any two terminals does not exceed a voltage level of the first logic one reference signal (i.e., VCC_1) plus a predetermined tolerance. In one embodiment, the predetermined tolerance is a percentage such as, but not limited to 20% of the voltage level of the first logic one reference signal (e.g., VCC_1). In other embodiments, the predetermined tolerance may vary.

For example, when the input signal 102 has a logic one value of 5 V and VCC_1 corresponds to 1.8 V while VCC_2 corresponds to 3.3 V, the first logic one reference signal has a voltage level of 1.8 V while the second logic one reference signal has a voltage level of 3.3 V. In the preferred embodiment, each of the MOSFETs in circuit 500 (and in circuit 100) have the same gate thickness and are designed and connected so that a maximum voltage difference between any two terminals does not exceed a voltage level of 1.8 V+a predetermined tolerance. In other words, the MOSFETS in this example are 1X transistors.

By implementing the circuit schematic of FIG. 5, current does not sink as is common in prior art systems that utilize resister dividers. Similarly, the employment of $M_{N2}$ and $M_{P2}$ and the selective routing of input signal 102 helps avoiding static leakage current.

Figure 6:
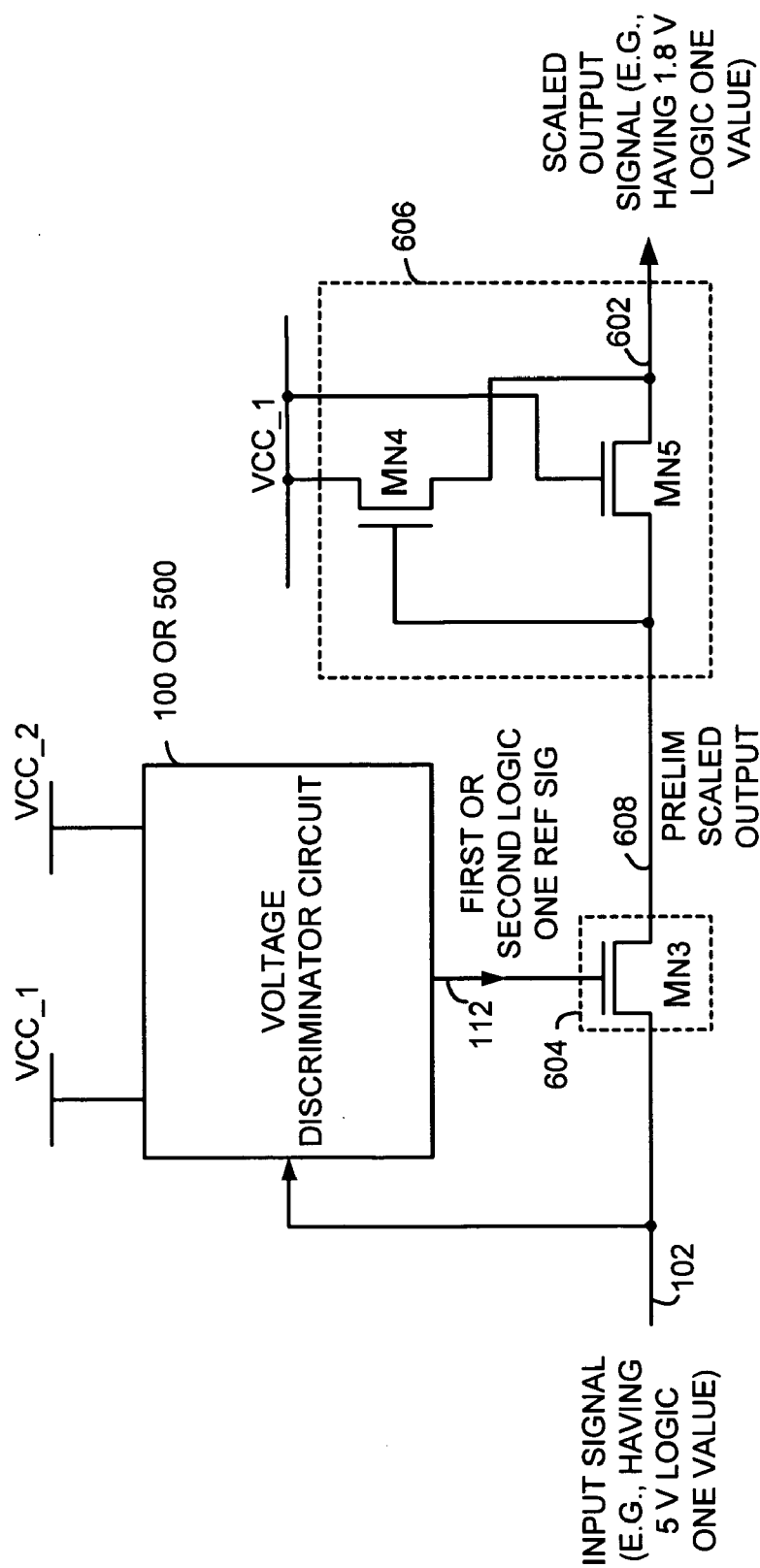
FIG. 6 is a block diagram illustrating one example of an integrated circuit operative to generate a scaled output signal based on an input signal and further incorporating a voltage discriminator circuit such as that illustrated in FIGS. 1 and 5 in accordance with one embodiment of the present disclosure.

FIG. 6 is a block diagram illustrating one example of an integrated circuit 600 operative to generate a scaled output signal 602 based on an input signal 102 and further incorporating a voltage discriminator circuit 100 or 500 such as that illustrated in FIGS. 1 and 5 in accordance with one embodiment of the present disclosure. As illustrated, the integrated circuit 600 further comprises a first voltage scaling circuit 604 and a second voltage scaling circuit 606 where the first voltage scaling circuit 604 receives both the input signal 102 and one of the first and second logic one reference signals 112. In response, the first voltage scaling circuit 604 generates a preliminary scaled output 608. Coupled to the first voltage scaling circuit 604, the second voltage scaling circuit 606 is also coupled to the first power supply VCC_1 and in response to the preliminary scaled output 608, generates the scaled output signal 602. In one embodiment, the integrated circuit 600 and its components discussed above are fabricated on one or more integrated circuits or one or more integrated circuit packages. In one embodiment, each of the transistors in circuit 600 are fabricated using MOS technology and are designed and connected so that a maximum voltage difference between any two terminals does not exceed a voltage level of the first logic one reference signal (i.e., VCC_1) plus a predetermined tolerance. In one embodiment, the predetermined tolerance is a percentage such as, but not limited to 20% of the voltage level of the first logic one reference signal (e.g., VCC_1). In other embodiments, the predetermined tolerance may vary.

In one embodiment, the first voltage scaling circuit 604 includes an NMOS transistor $M_{N3}$ where the gate is coupled to receive the first or second logic one reference signal 112, the first terminal is coupled to receive the input signal 112 and the second terminal is coupled to the second voltage scaling circuit 606. The second voltage scaling circuit 606 may include the voltage scaling circuit disclosed in U.S. Pat. No. 5,905,621 having application Ser. No. 09/004,795, owned by instant Assignee and hereby incorporated by reference. For example, the second voltage scaling circuit 606 may include NMOS transistors $M_{N4}$ and $M_{N5}$ wherein $M_{N4}$ has a gate coupled to the first terminal of $M_{N5}$ and further to receive the preliminary scaled output 608, a source coupled to the first voltage supply VCC_1 and to the gate of $M_{N5}$, and a drain coupled to the second output of $M_{N5}$ along which the scaled output signal 602 is generated.

As recognized by one having ordinary skill in the art, when the voltage level of the input signal 102 rises from a logic zero to a logic one (where the logic one value of input signal 102 is greater than the voltage levels of both the first and second voltage supplies VCC_1 and VCC_2), the scaled output signal 602 is the input signal 102 scaled to have a logic one voltage level of VCC_1. Thus, the first and second voltage scaling circuits 604 and 606 pass the input signal 102 through to the output 602 until the input signal 102 rises above the first preliminary voltage level of, for example, (VCC_1–$V_{TN}$). As the voltage level of the input signal 102 continues to rise, the preliminary scaled output 608 is never greater than the second preliminary voltage level of, for example, (VCC_2–$V_{TN}$). In other words, the preliminary scaled output signal 608 never exceeds the voltage level of the first voltage supply VCC_1 when the voltage discriminator circuit generates a first logic one reference signal and never exceeds the voltage level of the second voltage supply VCC_2 when the voltage discriminator circuit generates a second logic one reference signal. When the first voltage scaling circuit 604 scales the input signal 102 to the second preliminary voltage level of, for example, (VCC_2–$V_{TN}$), the second voltage scaling circuit 606 generates the scaled output signal 602 with a voltage level of the first voltage supply VCC_1. Thus, the scaled output signal 602 never rises greater than VCC_1.

In one embodiment, each of the voltage discriminator circuit, the first voltage scaling circuit and the second voltage scaling circuit comprises one or more integrated circuit components each having at least two terminals and wherein a maximum voltage difference between any two terminals of each integrated circuit component does not exceed a voltage level of the first logic one reference signal plus a predetermined tolerance. In one embodiment, each integrated circuit component is connected so that there is effectively no static leakage current across any integrated circuit terminal.

FIG. 7 is a flow chart illustrating a method for generating a scaled output signal based on an input signal and a logic one reference signal in accordance with one embodiment of the present disclosure. The method begins with block 202 and continues in block 702 where a first logic one reference signal is selectively generated when a voltage level of the input signal is less than a threshold value and where a second logic one reference signal is alternatively generated when the voltage level of the input signal is greater than or less than the threshold value. The voltage level of the first logic one reference signal is less than a voltage level of the second logic one reference signal and the voltage level of the second logic one reference signal is less than a logic one voltage level of the input signal. As described above, block 702 may be implemented using circuit 100 or circuit 500.

The method continues in block 704 where a preliminary scaled output signal is generated based on the input signal and one of: the first logic one reference signal and the second logic one reference signal. In one embodiment and as illustrated in block 710, the preliminary scaled output signal does not exceed: the voltage level of the first voltage supply when the voltage discriminator circuit generates a first logic one reference signal; and the voltage level of the second voltage supply when the voltage discriminator circuit generates a second logic one reference signal. Block 704 may be implemented using the first voltage scaling circuit 604 or any other suitable circuit. The method then continues to block 706 where the scaled output is generated based on the preliminary scaled output signal and wherein the scaled output has a logic one value corresponding to the voltage level of the first voltage supply. In one example, block 706 may be implemented using the second voltage scaling circuit 606 or any other suitable circuit. The method then concludes in block 708 where, for example, the scaled output signal is used by a protected circuit such as a chip set integrated circuit that uses transistors designed such that the maximum voltage difference between any two terminals does not exceed the voltage level of the first power supply plus a predetermined tolerance. In other words, the maximum voltage difference between any two terminals does not exceed the voltage level of the first logic one reference signal plus a predetermined tolerance.

In one embodiment, the generation of one or more of a first logic one reference signal, a second logic one reference signal, a preliminary scaled output signal and a scaled output signal is performed by a plurality of integrated circuit components each having at least two terminals and wherein a maximum voltage difference between any two terminals of each integrated circuit component does not exceed a voltage level of the first logic one reference signal plus a predetermined tolerance. In one embodiment, each integrated circuit component is connected so that there is effectively no static leakage current across any integrated circuit terminal.

This, a method and apparatus have been disclosed that addresses the above needs of the prior art. Specifically, an integrated circuit such as a voltage discriminator circuit is used to discern the voltage level of the input signal and generates one of a first logic one reference signal and a second logic one reference signal. The first logic one reference signal has a voltage level corresponding to a first voltage supply while the second logic one reference signal has a voltage level corresponding to a second voltage supply. The logic one voltage level of the input signal is greater than the voltage levels of both the first and second voltage supplies. When the voltage level of the input signal is less than a threshold amount, the first logic one reference signal is generated. When the voltage level of the input signal is greater than or equal to the threshold amount, the second logic one reference signal is generated. In at least one embodiment, MOS transistors are used to fabricate the integrated circuit and thus avoids sinking current as common in the prior art. In another embodiment, each of the MOS transistors are single gate oxide transistors and are designed and/or connected so that a maximum voltage difference between any two terminals does not exceed a voltage level of the first logic one reference signal (e.g., the first power supply) plus a predetermined tolerance. In another embodiment, static leakage current is reduced or eliminated by using MOS transistors in the low range and high range scalers to eliminate floating MOS transistor terminals.

As one example of a practical application, the voltage discriminator circuit may be used to generate a scaled output signal having a logic one value corresponding to the voltage level of first power supply by using the first and second logic one reference signals to control a first voltage scaling circuit. The output of the first voltage scaling circuit drives a second voltage scaling circuit to generated the scaled output signal. The scaled output signal may then be provided to, for example, any protected circuit such as a chip set circuit designed to safely interpret logic one values using fast and thin gate transistors as described above.

Among other advantages, the above method and apparatus discerns the voltage level of an input signal having a logic one voltage level greater than the voltage levels of the two power supplies without creating static leakage current or sinking current. In one practical application, by discerning the voltage level of the input signal, one of a first and second logic one reference signal may be generated to control a first voltage scaling circuit of a scaling circuit (such as that illustrated in FIG. 6). The output of the first voltage scaling circuit may be used to generate a scaled output signal that generally mirrors the input signal but has a logic one value corresponding to the first voltage supply.

It will also be recognized that the above description describes mere examples and that other embodiments are envisioned and covered by the appended claims. It is therefore contemplated that the present invention cover any and all modifications, variations or equivalents that fall within the spirit and scope of the basic underlying principles disclosed above and claimed herein.

What is claimed is:
1. An integrated circuit comprising:
   a first logic one reference signal generator operative to generate a first logic one reference signal when a voltage level of an input signal is less than a threshold value; and
   a second logic one reference signal generator operative to generate a second logic one reference signal when the voltage level of the input signal is greater than or equal to the threshold value, wherein the first logic one reference signal is based on a preliminary first logic one reference signal that is less than the threshold value and the second logic one reference signal is based on a preliminary second logic one reference signal that is greater than the threshold value.

2. The integrated circuit of claim 1, wherein each of the first logic one reference signal generator and the second logic one reference signal generator comprises one or more integrated circuit components each having at least two terminals and wherein a maximum voltage difference between any two terminals of each integrated circuit component does not exceed a voltage level of the first logic one reference signal plus a predetermined tolerance.

3. The integrated circuit of claim 1, wherein the integrated circuit further comprises a voltage range router selective operative to route the input signal to one of: the first logic one reference signal generator and the second logic one reference signal generator based on the voltage level of the input signal.

4. An integrated circuit comprising:
   a first logic one reference signal generator operative to generate a first logic one reference signal when a voltage level of an input signal is less than a threshold value; and
   a second logic one reference signal generator operative to generate a second logic one reference signal when the voltage level of the input signal is greater than or equal to the threshold value, wherein the first logic one voltage generator comprises:
a feedback latch; and
a low range scaler operatively coupled to the feedback latch and operative to generate a preliminary first logic one reference signal when the voltage level of the input signal is less than a first preliminary voltage level, wherein the first preliminary voltage level is less than the threshold value, wherein the feedback latch is operative to generate the first logic one reference signal based on the preliminary first logic one reference signal when the voltage level of the input signal is less than the threshold value.

5. An integrated circuit comprising:
a first logic one reference signal generator operative to generate a first logic one reference signal when a voltage level of an input signal is less than a threshold value; and
a second logic one reference signal generator operative to generate a second logic one reference signal when the voltage level of the input signal is greater than or equal to the threshold value, wherein the second logic one voltage generator comprises:
a feedback latch; and
a high range scaler operatively coupled to the feedback latch and operative to generate a preliminary second logic one reference signal when the voltage level of the input signal is equal to the threshold value and when the voltage level of the input signal is greater than or equal to a second preliminary voltage level, wherein the second preliminary voltage level is greater than the threshold value, wherein the feedback latch is operative to generate the second logic one reference signal based on the preliminary second logic one reference signal when the voltage level of the input signal is greater than or equal to the threshold value.

6. The integrated circuit of claim 1, further comprising an output buffer operative to:
buffer one of: the first logic one reference signal and the second logic one reference signal; and
generate a corresponding one of: a buffered first logic one reference signal and a buffered second logic one reference signal.

7. The integrated circuit of claim 1, wherein the integrated circuit is integrated on a chip set circuit.

8. The integrated circuit of claim 1, wherein the input signal is provided by a peripheral input signal source.

9. The integrated circuit of claim 1, wherein each integrated circuit component is connected so that there is effectively no static leakage current across any integrated circuit terminal.

10. The integrated circuit of claim 1, wherein:
each of the voltage range router, the first logic one reference signal generator and the second logic one reference signal generator comprises a plurality of single gate oxide MOSFETs, and
each single gate oxide MOSFET is connected so that a maximum voltage difference between any two terminals does not exceed a voltage level of the first logic one reference signal plus a predetermined tolerance.

11. A method for generating a logic one reference signal comprising:
selectively generating a first logic one reference signal when a voltage level of an input signal is less than a threshold value; and
alternatively generating a second logic one reference signal when the voltage level of an input signal is greater than or equal to the threshold value, wherein the first logic one reference signal is based on a preliminary first logic one reference signal that is less than the threshold value and the second logic one reference signal is based on a preliminary second logic one reference signal that is greater than the threshold value.

12. The method of claim 11, wherein:
selectively generating the first logic one reference signal and alternately generating the second logic one reference signal is performed by a plurality of single gate oxide MOSFETS each connected so that a maximum voltage difference between any two terminals of each MOSFET does not exceed a voltage level of the first logic one reference signal plus a predetermined tolerance, and
each MOSFET is connected so that there is effectively no static leakage current across any integrated circuit terminal.

13. A method for generating a logic one reference signal comprising:
selectively generating a first logic one reference signal when a voltage level of an input signal is less than a threshold value; and
alternatively generating a second logic one reference signal when the voltage level of an input signal is greater than or equal to the threshold value, wherein:
selectively generating the first logic one reference signal when the voltage level of the input signal is less than the threshold value comprises:
generating a preliminary first logic one reference signal when the voltage level of the input signal is less than a first preliminary voltage level, wherein the first preliminary voltage level is less than the threshold value; and
generating the first logic one reference signal based on the preliminary first logic one reference signal when the voltage level of the input signal is less than the threshold value, and
alternatively generating the second logic one reference signal when the voltage level of the input signal is greater than or equal to the threshold value comprises:
generating a preliminary second logic one reference signal when the voltage level of the input signal is equal to the threshold value and when the voltage level of the input signal is greater than or equal to a second preliminary voltage level, wherein the second preliminary voltage level is greater than the threshold value; and
generating the second logic one reference signal based on the preliminary second logic one reference signal when the voltage level of the input signal is greater than or equal to the threshold value.

14. The method of claim 11, wherein the input signal is provided by a peripheral input signal source.

15. An integrated circuit comprising:
a voltage discriminator circuit operatively coupled to a first voltage supply and a second voltage supply, wherein the second voltage supply has a voltage level greater than a voltage level of the first voltage supply, and wherein the voltage discriminator circuit is selectively operative to generate a first logic one reference signal when a voltage of an input signal is less than a threshold value, and alternatively operative to generate a second logic one reference signal when a voltage of the input signal is greater than or equal to the threshold value, wherein the input signal has a logic one value greater than the voltage level of the second voltage supply;

a first voltage scaling circuit operative to generate a preliminary scaled output signal based on the input signal and one of: the first logic one reference signal and the second logic one reference signal; and a second voltage scaling circuit operative to generate the scaled output signal based on the preliminary scaled output signal, wherein the scaled output has a logic one value corresponding to the voltage level of the first voltage supply.

16. The integrated circuit of claim 15, wherein the preliminary scaled output signal does not exceed:

the voltage level of the first voltage supply when the voltage discriminator circuit generates a first logic one reference signal; and the voltage level of the second voltage supply when the voltage discriminator circuit generates a second logic one reference signal.

17. The integrated circuit of claim 15, wherein:

the first logic one reference signal has a voltage level corresponding to the first voltage supply, and the second logic one reference signal has a voltage level corresponding to the second voltage supply.

18. The integrated circuit of claim 15, wherein the voltage discriminator circuit comprises:

a first logic one reference signal generator operative to generate the first logic one reference signal when the voltage level of the input signal is less than the threshold value; and a second logic one reference signal generator operative to generate the second logic one reference signal when the voltage level of the input signal is greater than or equal to the threshold value.

19. The integrated circuit of claim 18, wherein the voltage discriminator circuit further comprises a voltage range router selectively operative to route the input signal to one of: the first logic one reference signal generator and the second logic one reference signal generator based at least on the voltage level of the input signal.

20. The integrated circuit of claim 18, wherein each of the voltage discriminator circuit, the first voltage scaling circuit and the second voltage scaling circuit comprises one or more integrated circuit components each having at least two terminals and wherein a maximum voltage difference between any two terminals of each integrated circuit component does not exceed a voltage level of the first logic one reference signal plus a predetermined tolerance.

* * * * *